(12) United States Patent
Pritchard et al.

(10) Patent No.: US 9,947,590 B1
(45) Date of Patent: Apr. 17, 2018

(54) METHOD, APPARATUS, AND SYSTEM FOR USING A COVER MASK FOR ENABLING METAL LINE JUMPING OVER MOL FEATURES IN A STANDARD CELL

(71) Applicant: GLOBALFOUNDRIES INC., Grand Cayman (KY)

(72) Inventors: David C. Pritchard, Beacon, NY (US); Tuhin Guha Neogi, Fishkill, NY (US); Scott Luning, Albany, NY (US); David Doman, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/294,228

(22) Filed: Oct. 14, 2016

(51) Int. Cl.
| | | |
|---|---|---|
| *H01L 21/00* | (2006.01) |
| *H01L 21/8234* | (2006.01) |
| *H01L 21/768* | (2006.01) |
| *H01L 21/321* | (2006.01) |
| *H01L 21/311* | (2006.01) |
| *H01L 21/027* | (2006.01) |
| *H01L 23/528* | (2006.01) |
| *H01L 23/522* | (2006.01) |
| *H01L 29/66* | (2006.01) |
| *H01L 29/08* | (2006.01) |

(52) U.S. Cl.
CPC .. *H01L 21/823475* (2013.01); *H01L 21/0274* (2013.01); *H01L 21/31111* (2013.01); *H01L 21/3212* (2013.01); *H01L 21/7684* (2013.01); *H01L 21/76802* (2013.01); *H01L 21/76834* (2013.01); *H01L 21/76877* (2013.01); *H01L 21/76895* (2013.01); *H01L 21/823418* (2013.01); *H01L 23/5222* (2013.01); *H01L 23/5286* (2013.01); *H01L 29/0847* (2013.01); *H01L 29/66568* (2013.01)

(58) Field of Classification Search
CPC ....... H01L 21/823475; H01L 21/76834; H01L 21/76895; H01L 21/7684; H01L 21/3212; H01L 21/31111; H01L 21/76802; H01L 21/76877; H01L 21/0274; H01L 21/823418; H01L 23/5286; H01L 23/5222; H01L 29/66568; H01L 29/0847
See application file for complete search history.

(56) References Cited

U.S. PATENT DOCUMENTS

| | | | | |
|---|---|---|---|---|
| 7,695,897 B2 * | 4/2010 | Bucchignano | .... | H01L 21/31144 216/58 |
| 7,829,454 B2 * | 11/2010 | Suzuki | ............ | H01L 21/28562 257/E21.584 |
| 8,143,159 B2 * | 3/2012 | King | ................ | H01L 21/76807 438/672 |

(Continued)

*Primary Examiner* — Savitr Mulpuri
(74) *Attorney, Agent, or Firm* — Williams Morgan, P.C.

(57) ABSTRACT

At least one method, apparatus and system disclosed involves providing an integrated circuit having metal feature flyover over an middle-of-line (MOL) feature. A first location for a non-contact intersection region between a first middle of line (MOL) interconnect feature and a metal feature in a functional cell is determined. A dielectric feature is formed over the first MOL interconnect feature at the first location. The metal feature is formed over the dielectric layer, the dielectric layer providing a predetermined amount of voltage isolation between the first MOL interconnect feature and the metal feature.

13 Claims, 7 Drawing Sheets

(56) References Cited

U.S. PATENT DOCUMENTS

| | | | | |
|---|---|---|---|---|
| 8,709,855 | B2* | 4/2014 | Gambino | H01L 23/552 |
| | | | | 257/E21.456 |
| 9,029,956 | B2* | 5/2015 | Mann | H01L 27/0207 |
| | | | | 257/369 |
| 9,337,093 | B2* | 5/2016 | Oshida | H01L 21/76883 |
| 9,390,967 | B2* | 7/2016 | Lee | H01L 21/7682 |
| 9,524,935 | B2* | 12/2016 | Rullan | H01L 23/528 |
| 2009/0001592 | A1* | 1/2009 | Barth | H01L 21/76837 |
| | | | | 257/770 |
| 2010/0035370 | A1* | 2/2010 | Ding | H01Q 9/28 |
| | | | | 438/29 |
| 2010/0237442 | A1* | 9/2010 | Li | H01L 21/02126 |
| | | | | 257/411 |
| 2014/0197520 | A1* | 7/2014 | Choi | H01L 28/20 |
| | | | | 257/536 |
| 2016/0155704 | A1* | 6/2016 | Lee | G06F 17/5068 |
| | | | | 257/774 |

* cited by examiner

METHOD, APPARATUS, AND SYSTEM FOR USING A COVER MASK FOR ENABLING METAL LINE JUMPING OVER MOL FEATURES IN A STANDARD CELL

BACKGROUND OF THE INVENTION

Field of the Invention

Generally, the present disclosure relates to the manufacture of sophisticated semiconductor devices, and, more specifically, to various methods and structures for using a cover mask for allowing metal lines to be jumped over PC connection features in standard cells, or manufacturing semiconductor devices.

Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

In this manner, integrated circuit chips may be fabricated. In some cases, integrated circuit or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

When designing a layout of various devices with an integrated circuits (e.g., CMOS logic architecture), designers often select pre-designed functional or standard cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or lower integrated circuit designs.

As the dimensions of standard cells become smaller, routing problems tend to increase. Designers have turned to developing technology that include direct connection to a metal layer and middle-of-line (MOL) features, such as CA, CB, and or trench silicide (TS) features, without using intermediate vias. In this technology, routing a metal feature (e.g., M1 feature) may be difficult since it may contact an MOL feature unless the metal features is routed around the MOL feature. This routing around technique can reduce routing efficiency in standard cells.

FIG. 1A illustrates a stylized depiction of a typical standard cell having a metal layer that is in direct connection with an MOL feature. FIG. 1B illustrates a stylized cross-sectional depiction of the cell of FIG. 1A. The cross-sectional view of FIG. 1B is of the view at the dotted line 105 shown in FIG. 1A.

Referring simultaneously to FIGS. 1A and 1B, a cell 100 comprises a plurality of routing tracks (e.g., M1 routing tracks) on which metal routing features may be formed. The cell 100 includes a $1^{st}$ active area 110 and a $2^{nd}$ active area 120, in which source/drain features may be formed.

A plurality of PC (gate) features 130 for transistors are formed in the cell 100. A plurality of middle of line (MOL) features may be formed to provide interconnection between source/drain features, as well as for gate features 130. A CA feature 170 may be formed in the cell 100. Further, a CB feature 175 may be formed over a PC feature 130.

FIG. 1B illustrates a cross-sectional view of the cell 100. A substrate layer 150 is formed. A dielectric layer 160, e.g., silicon nitride, is formed above the substrate layer 150. The PC features 130, the CA feature 170, and a CB feature 175 are formed above the substrate layer, within the dielectric layer 160. The $1^{st}$ metal feature 120a is formed above the dielectric layer 160. The $1^{st}$ metal feature 120a comes into contact with the CA feature 170 in the region denoted by the circle 140.

The cell 100 is of technology that provides for direct connection from the first metal layer (M1 layer) to MOL features, without using an intermediate via. A plurality of metal features may be also formed in the cell 100. A $1^{st}$ metal feature 120a and a $2^{nd}$ metal feature 120b are formed in the cell 100.

The $1^{st}$ metal feature 120a is formed above the dielectric layer 160. In some cases, the $1^{st}$ metal feature 120a comes into contact with the CA feature 170 in the region denoted by the circle 140. The coupling of the $2^{nd}$ metal feature 120b may be desired. However, the coupling of the $1^{st}$ metal feature 120a to the CA feature 170 (see circle 140) is not desired. In order to avoid this contact (indicated by the circle 140), the $1^{st}$ metal feature 120a would have to be routed around the CA feature 170. This would require usage of more space, leading to routing and space inefficiencies.

FIG. 2 illustrates a stylized depiction of another example of a typical cell having technology that provides for direct connection from the first metal layer (M1 layer) to MOL features. FIG. 2 illustrates a cell 200 that may be formed using an SADP process. In an SADP process, the metal features that are formed are typically referred to as either "mandrel-metal" features ("MM") or "non-mandrel-metal" features ("NMM"). As it relates to terminology, the MM features and NMM features are referred to as being different "colors" when it comes to decomposing an overall pattern layout that is intended to be manufactured using an SADP process. Thus, two MM features are said to be of the "same color" and two NMM features are said to be of the "same color," while an MM feature and an NMM feature are said to be of "different colors."

The cell 200 comprises metal features of a different colors. A plurality of metal features of a $1^{st}$ color 220a may be formed, included a $1^{st}$ power rail 222 coupled to a VDD signal and a $2^{nd}$ power rail 224 coupled to a VSS signal. The cell 200 may comprise a $1^{st}$ active area 210a and a $2^{nd}$ active area 210b.

A plurality of metal features of a $2^{nd}$ color 220b may also be formed in the cell 200. The cell 200 also includes a plurality of CA features 270, a plurality of CB features 180, and a plurality of vertical PC (gate) features 220. Some designers have expressed the desire to connect multiple PC features 220 by using a horizontal (wrong way) PC feature 225, as shown in FIG. 2. However, this design would be impractical in state-of-the-art designs, particularly due to the strong dipole illumination required for the modern pitch and gate lengths. Further, using horizontal metal layer features to connect a the PC features 220 may cause inadvertent connections to MOL features, similar to the problems illustrated above with regard to FIG. 1. Routing metal features around MOL features to avoid this issue may cause other problems, such as routing congestion, design error rule violations, etc. Therefore, as described above, there are various inefficiencies, routing difficulties, design rule errors, and other problems associated with the state-of-art.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for providing an integrated circuit having metal feature flyover over an middle-of-line (MOL) feature. A first location for a non-contact intersection region between a first middle of line (MOL) interconnect feature and a metal feature in a functional cell is determined. A dielectric feature is formed over the first MOL interconnect feature at the first location. The metal feature is formed over the dielectric layer, the dielectric layer providing a predetermined amount of voltage isolation between the first MOL interconnect feature and the metal feature.

BRIEF DESCRIPTION OF THE DRAWINGS

The disclosure may be understood by reference to the following description taken in conjunction with the accompanying drawings, in which like reference numerals identify like elements, and in which.

Figure 1A:
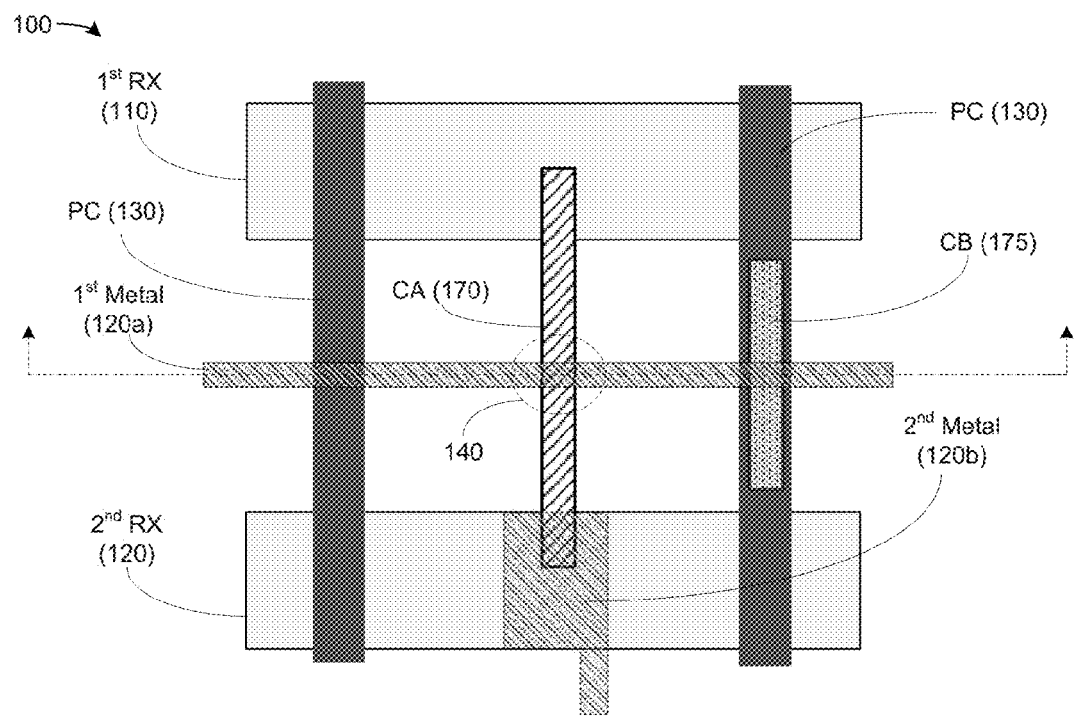
FIG. 1A illustrates a stylized depiction of a typical standard cell having a metal layer that is in direct connection with an MOL feature.
Figure 1B:
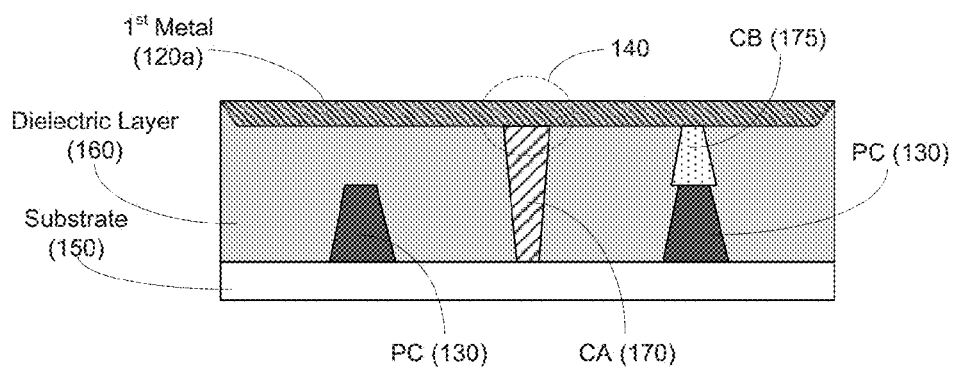
FIG. 1B illustrates a stylized, cross-sectional depiction of the cell of FIG. 1A.
Figure 2:
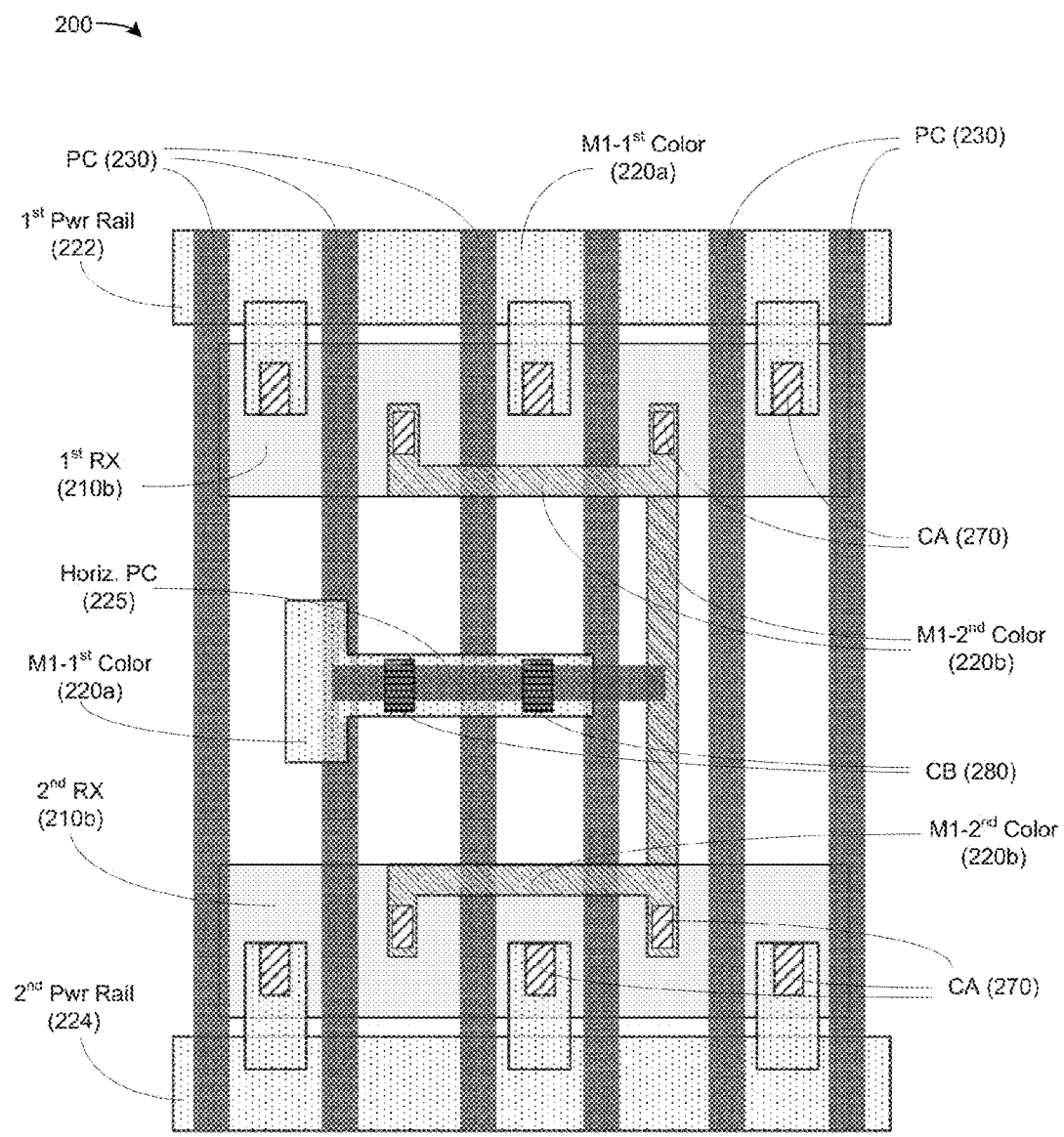
FIG. 2 illustrates a stylized depiction of another example of a typical cell having technology that provides for direct connection from the first metal layer (M1 layer) to MOL features.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing a routing process for forming an integrated circuit. The routing process of embodiments herein may be utilized in forming a functional/standard cell. Embodiments herein provide for a "flyover" metal and/or middle-of-line (MOL) feature that may be used to electrically couple a plurality of features (e.g., PC (gate) features) formed across an integrated circuit, such a standard cell. In one embodiment, the term "flyover" relates to a $1^{st}$ cell feature (e.g., an M1 metal line) that spans across another cell feature (e.g., a CA feature) without making contact with each other.

In some embodiments, a flyover M1 metal feature may be used to connect a plurality of PC (gate) features. In other embodiments, a plurality of PC (gate) features may be electrically connected using a CB bar, while using the flyover or cover mask of embodiments herein to use a metal feature to connect the source and/or drain regions in an integrated circuit. Accordingly, more efficient routing may be performed in order to connect features across an integrated circuit (e.g., a standard cell). Embodiments herein may be applied to technologies that provide for direct connection between the first metal layer to MOL layers, without having to incorporate an intermediate via.

In some embodiments, an etch selective cover layer may be formed selectively over predetermined region(s) that have been designated to prevent an electrical coupling between a metal feature and an MOL feature, while routing the metal or MOL feature across the predetermined region (s). Embodiments herein provide for the etch selective cover layer to be sufficiently thick to prevent a negative impact to capacitance, leakage, or operation reliability relating to the region covered by the cover layer, and yet, to be sufficiently thin as to not interfere with the topology of the metal layer (e.g., M1 layer).

Figure 3:
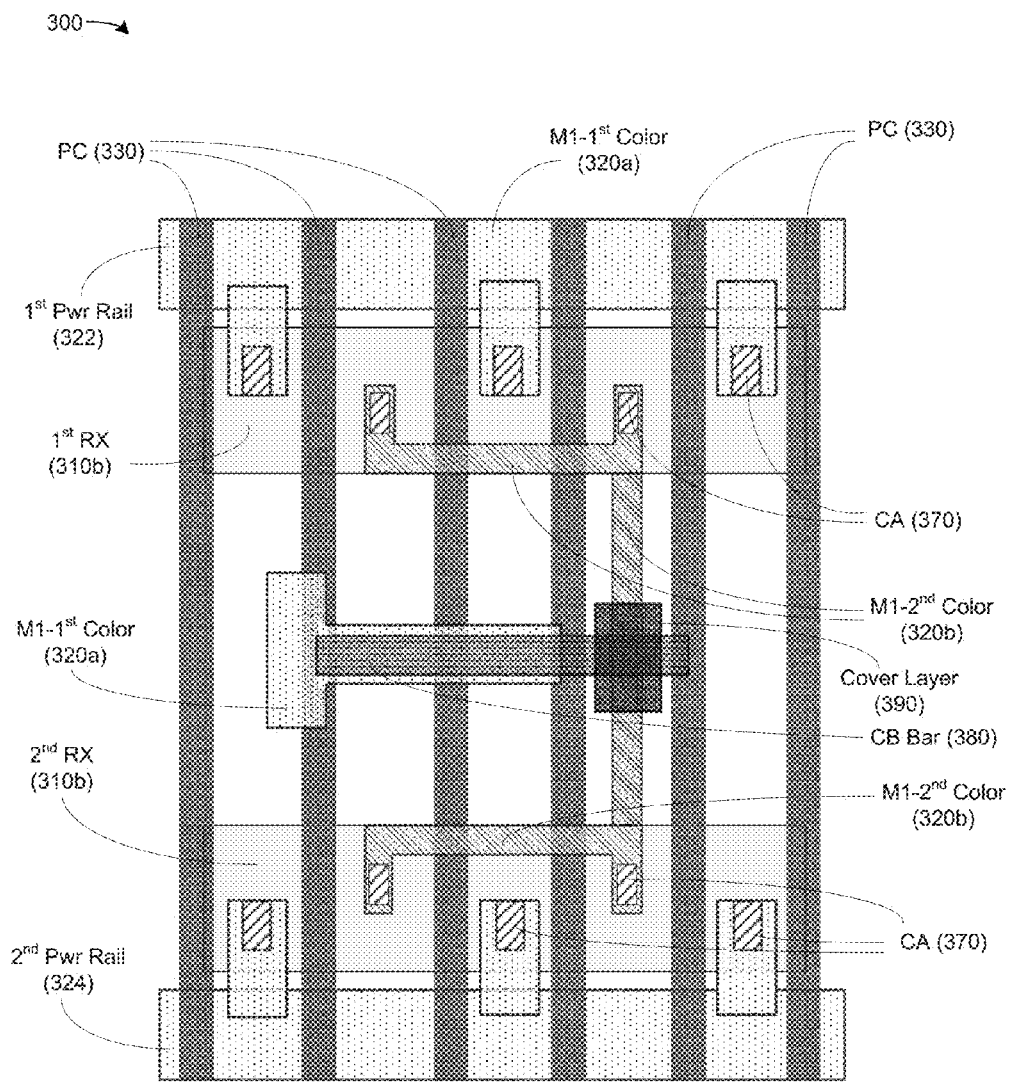
FIG. 3 illustrates a stylized depiction of a standard cell, in accordance with some embodiments herein.

Turning now to FIG. 3, a stylized depiction of a standard cell, in accordance with some embodiments herein is illustrated. The functional/standard cell 300 comprises metal features of a different colors. A plurality of metal features of a $1^{st}$ color 320a may be formed, including a $1^{st}$ power rail 322 coupled to a VDD signal, and a $2^{nd}$ power rail 324 coupled to a VSS signal. The cell 300 may comprise a $1^{st}$ active region 310a and a $2^{nd}$ active region 310b.

Moreover, a plurality of metal features of a $2^{nd}$ color 320b may also be formed generally in the $1^{st}$ and $2^{nd}$ active areas 310a, 310b. The cell 300 may also comprise a plurality of CA features 370 formed in the $1^{st}$ and $2^{nd}$ active areas 310a, 310b. The cell 300 also includes a CB bar 380 and a plurality of vertical PC (gate) features 320.

An exemplary design may call for electrically coupling a plurality of the PC features 320 in the cell 300. In order to reduce any issues relating to dipole illumination required for smaller pitch (e.g., 10 nm, 8.75 T technology or smaller), a flyover mask may be provided to form a metal feature or an MOL feature to route a connection between the plurality of transistor features (e.g., connection between PC feature, connection between source and drain features, etc.).

In one embodiment, in order to provide a connection between the plurality of PC features 320, the CB bar 380 is positioned to provide such connection. A cover layer 390 over CA or CB formations may be formed in order to provide a flyover capability for an M1 feature. Therefore, in one embodiment, an M1 metal feature (e.g., an M1-$2^{nd}$ color 320b) may be formed in a vertical configuration over the cover layer 390 for connecting a plurality of PC features 330 or other transistors feature, such as the source formation and drain formations. For example, a portion of the M1-$2^{nd}$ color feature 320 may be used to connect the source/drain features in the $1^{st}$ and $2^{nd}$ active areas 310a, 310b.

The flyover or cover mask 390 may be used to allow for the M1-$2^{nd}$ color metal features 320 to connect source and drain regions of the cell 300. The cover mask 390 provide a dielectric buffer (with predetermined voltage isolation and/or predetermined capacitive parameters) between the M1-$2^{nd}$ color metal features 320 and the CA and CB features 370, 380. In this manner, inadvertent, undesirable contact between the M1-$2^{nd}$ color feature 320 and the MOL features (CA, CB) may be avoided, while providing for efficient routing. These embodiments also allow for routing metal features over MOL features to avoid problems such as routing congestion, design error rules violations, etc. Therefore, embodiments herein provide for reducing various inefficiencies associated with routing around CA/CB features and design rule violations.

FIGS. 4-11 illustrate stylized depictions of various process steps for forming an MOL cover layer for providing a connection flyover feature, in accordance with embodiments herein. FIGS. 4-11 illustrate a plurality of process steps that may be performed to form a functional/standard cell 400. FIGS. 4-11 illustrate a cross-sectional view of the standard cell 400.

Figure 4:
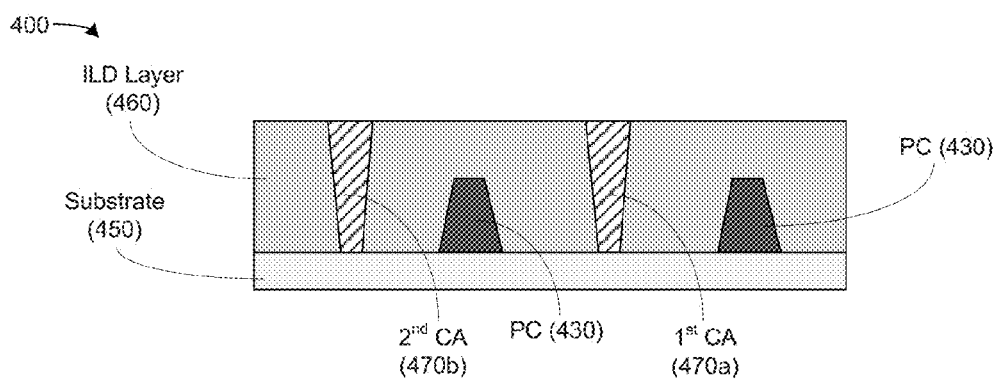
FIGS. 4-11 illustrate stylized depictions of various process steps for forming an MOL cover layer for providing a connection flyover feature, in accordance with embodiments herein.

A substrate layer 450 (e.g., silicon substrate) is formed. An interlayer dielectric (ILD) layer 460 may be formed over the substrate layer 450. Using process steps known to those skilled in the art having benefit of the present disclosure, a $1^{st}$ CA feature 470a, a $2^{nd}$ CA feature 470b, and a plurality of PC (gate) features 430 may be formed within the ILD layer 460. FIG. 4 provides a depiction of the cell 400 after performing a CA process post fill, and a chemical-mechanical polishing (CMP) process. Those skilled in the art having benefit of the present disclosure would appreciate that other features (e.g., MOL features, such as CB features) may be formed within the cell 400 of FIGS. 4-11 and remain within the spirit of the present invention.

Figure 5:
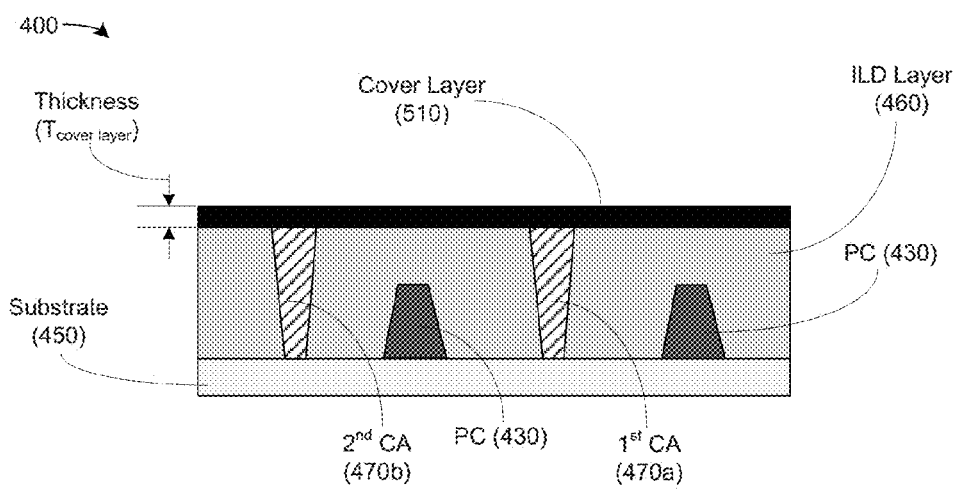

As shown in FIG. 5, a cover layer 510 may be selectively added over MOL features over which a metal flyover feature may be formed. In one embodiment, the cover layer 510 may be made substantially of silicon nitride material, or other material that satisfies capacitance, etch selectivity and/or isolation performance. The cover layer 510 may be a layer that is selective to contact dielectric.

The cover layer 510 may be of a predetermined thickness ($T_{cover\ layer}$), which in one embodiment, may be optimized for capacitance and isolation performance, e.g., on the order of 10s of nanometers. In one embodiment, the thickness may be a function of a predetermined value of voltage isolation desired between the MOL feature that is covered by the cover layer 510, and the flyover metal feature (see Eq. 1). In another embodiment, the thickness may be a function of predetermined capacitive parameters with regard to the MOL feature that is covered by the cover layer 510, and the flyover metal feature (see Eq. 2). In yet another embodiment, the thickness may be a function of both, the predetermined value of voltage isolation, as well as the capacitive parameters (see Eq. 3). See Equations 1, 2, and 3 below:

$$T_{cover\ layer}=f\{V_{isolation}\} \qquad \text{Eq. 1;}$$

$$T_{cover\ layer}=f\{C\} \qquad \text{Eq. 2;}$$

$$T_{cover\ layer}=f\{V_{isolation},C\} \qquad \text{Eq. 3;}$$

where $T_{cover\ layer}$ is the thickness of the cover layer 510, $V_{isolation}$ is the voltage isolation desired between the MOL feature that is covered by the cover layer 510 and the flyover metal feature, and C is the capacitive parameters with regard to the MOL feature that is covered and the flyover metal feature.

Figure 6:
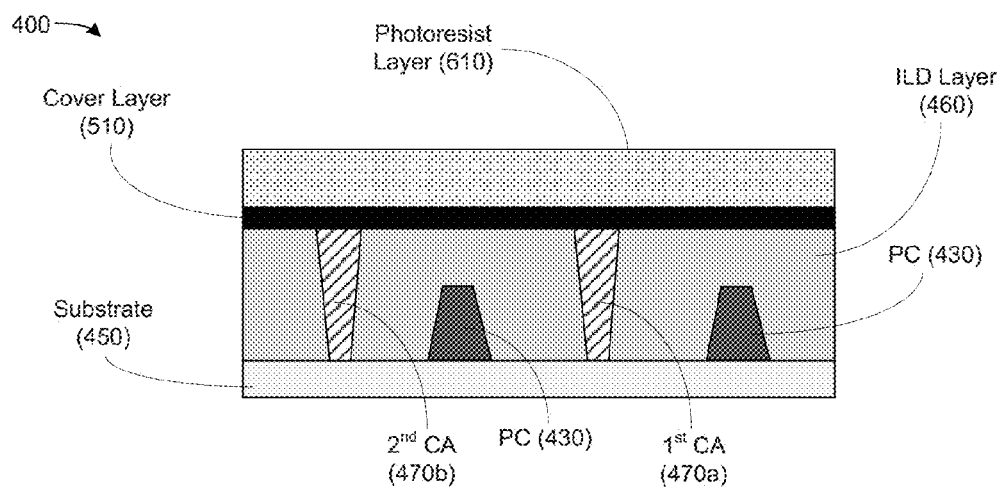
Figure 7:
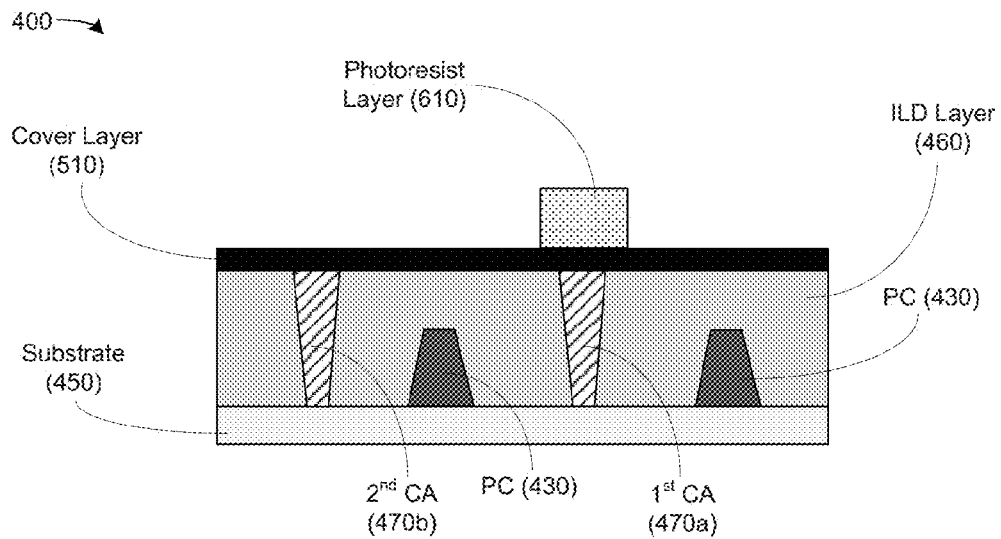

As shown in FIG. 6, a photolithography is initiated by depositing a photoresist layer 610. Subsequently, as shown in FIG. 7, a portion of the photoresist layer 610 is removed, leaving a predetermined remaining area of photoresist material. The remaining photoresist layer 610 portion is located in a targeted region above the MOL feature (i.e., $1^{st}$ CA 470a) that is to be shielded away from a metal feature that would be deposited above.

Figure 8:
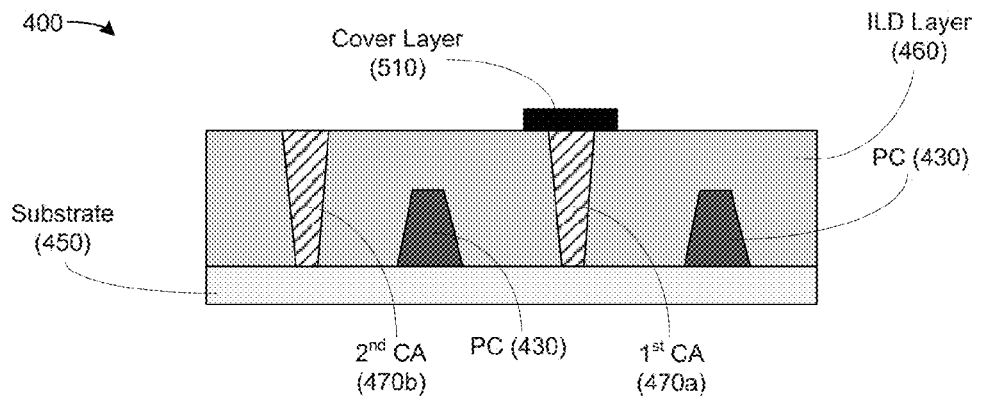

Subsequently, as shown in FIG. 8, an etch process may be performed to remove unwanted portions of the cover layer 510. The remaining photoresist layer 610 is also subsequently removed, leaving a portion of the cover layer 510 that remains over the targeted region above the MOL feature (i.e., $1^{st}$ CA 470a) that is to be shielded away from a metal feature that would be deposited above.

Figure 9:
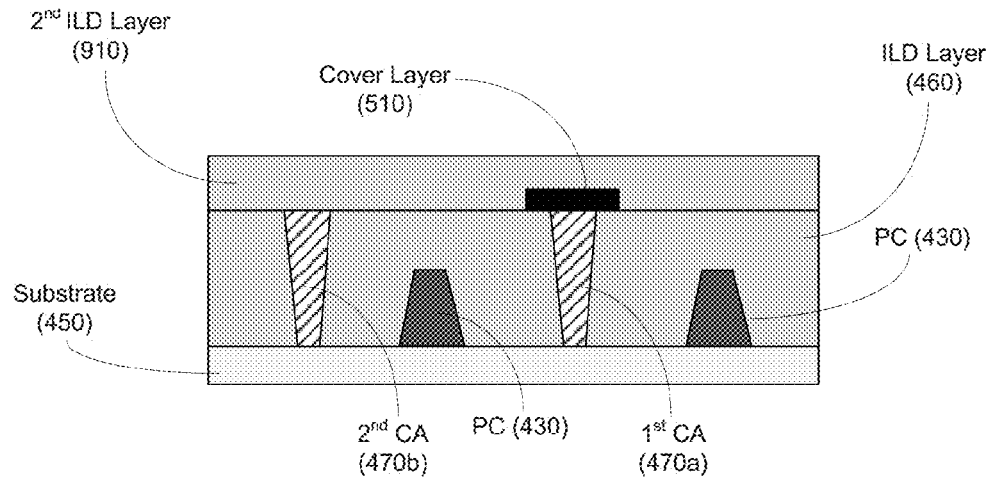

As shown in FIG. 9, a dielectric deposition process may be subsequently performed. In one embodiment, an ILD deposition process may be performed to deposit a $2^{nd}$ ILD material layer 910 over the cell 400, covering the cover layer 510. In one embodiment, an ILD CMP process may be performed to smooth out the ILD layer 910 as well as the cover layer 510.

A trench 1010 may then be formed in the ILD layer 910 to accommodate a metal feature that would be formed on cell 400. As shown in FIG. 9, a trench patterning and etch process may be performed to form the trench 1010. The trench patterning and etch process are performed selectively around the remaining cover layer 510, preserving the cover layer 510 above the $1^{st}$ CA feature 470a.

Figure 10:
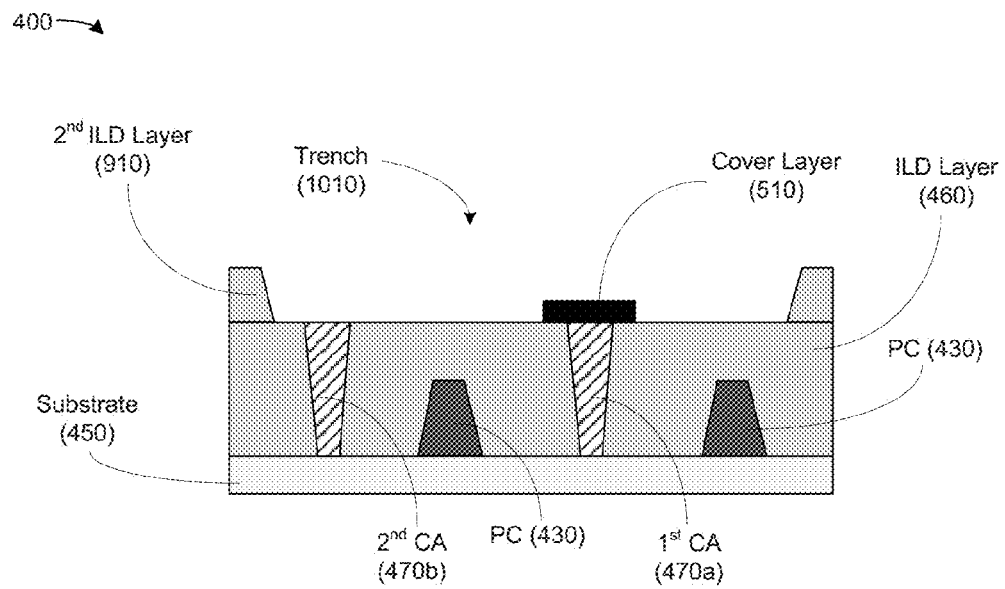
Figure 11:
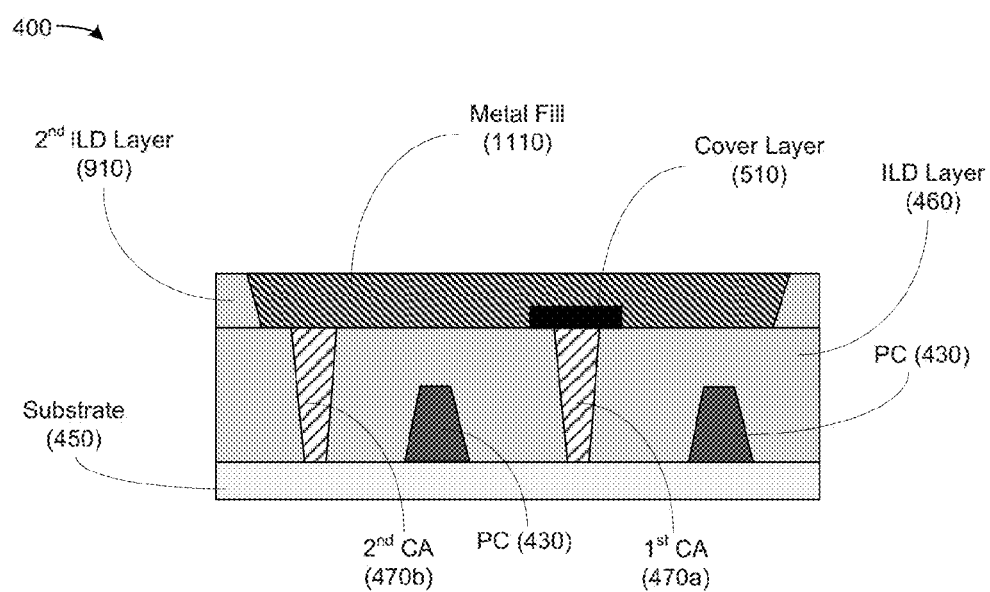

A metal lithography process may be subsequently performed. An etch process may then be performed in preparation for depositing a metal feature. A metal deposition process may be performed to fill in the trench 1010 with an M1 metal material, forming a metal feature 1110, as shown in FIG. 10. A CMP process may then be performed to smooth out the metal feature 1110 as well as the ILD layer portion 910 adjacent the metal feature 1110. In this manner a flyover metal feature may be formed, wherein the metal feature 1110 traverses the cell 400, avoiding contact with the a predetermined MOL feature (i.e., $1^{st}$ CA 470a), while electrically coupling to another MOL feature (i.e., $2^{nd}$ CA feature 470b) and/or other features on the cell 400. Similar process steps may be performed for crossing over other MOL features, while electrically coupling with other MOL features. Subsequently, other process steps known to those skilled in the art having benefit of the present disclosure may be performed to complete forming the cell 400.

Further processing known to those skilled in the art having benefit of the present disclosure may be performed to form vertical metal features, MOL features (e.g., CA, CB, TS features), vias, etc., for forming the functional cell 400. As such, the functional cell 400 may be formed to provide one or more predetermined functions, while comprising one or more flyover metal features that provide for more efficient methods of coupling a plurality of other features (e.g., a plurality of PC (gate) features) while maintaining efficient routing paths. This provides for forming standard cells that more dense.

Figure 12:
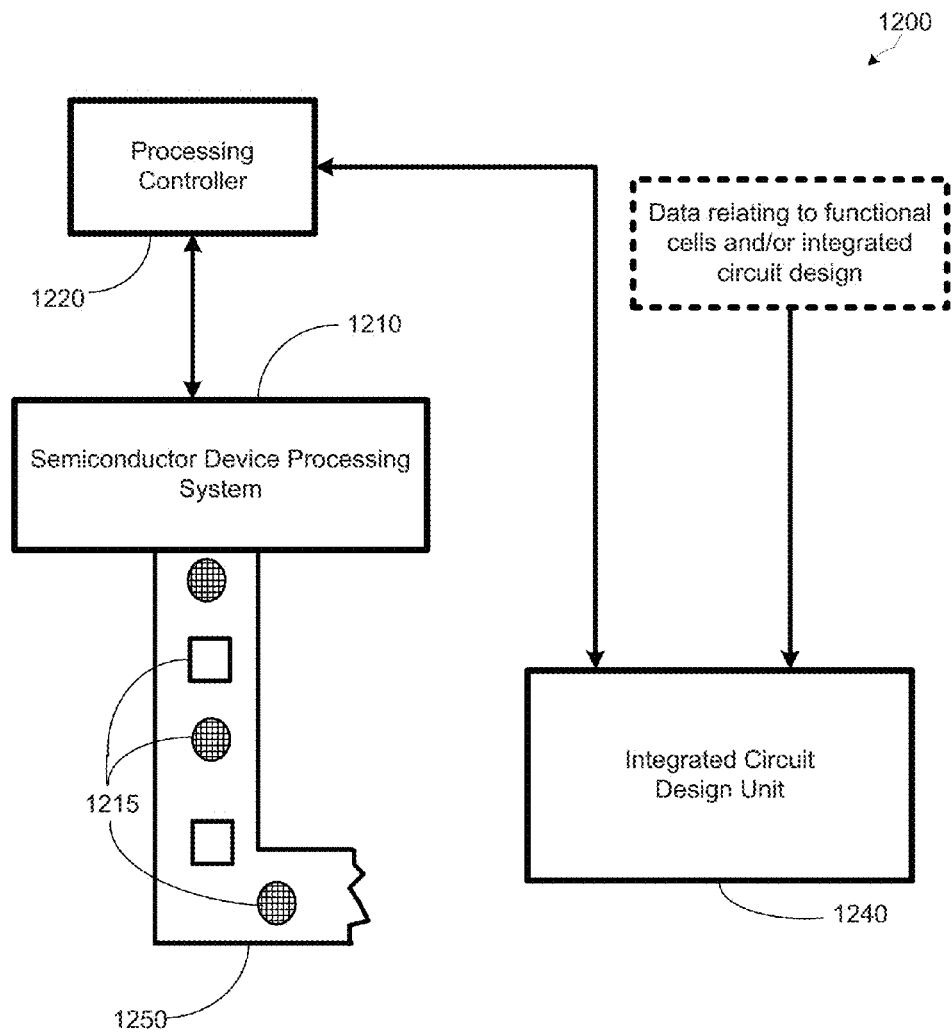
FIG. 12 illustrates semiconductor device processing system for manufacturing a functional cell, in accordance with some embodiments herein.

Turning now to FIG. 12, a stylized depiction of a system for fabricating a semiconductor device, in accordance with embodiments herein, is illustrated. The system 1200 of FIG. 12 may comprise a semiconductor device processing system 1210 and a design unit 1240. The semiconductor device processing system 1210 may manufacture integrated circuit devices based upon one or more designs provided by the design unit 1240.

The semiconductor device processing system 1210 may comprise various processing stations, such as etch process stations, photolithography process stations, CMP process stations, etc. One or more of the processing steps performed by the processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. The production of integrated circuits by the device processing system 1210 may be based upon the circuit designs provided by the integrated circuits design unit 1240. The processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may comprise a plurality of processing steps, e.g., the $1^{st}$ process step, the $2^{nd}$ process set, etc., as described above.

In some embodiments, the items labeled "1215" may represent individual wafers, and in other embodiments, the items 1215 may represent a group of semiconductor wafers, e.g., a "lot" of semiconductor wafers. The integrated circuit or device 1215 may be a transistor, a capacitor, a resistor, a memory cell, a processor, and/or the like. In one embodiment, the device 1215 is a transistor and the dielectric layer is a gate insulation layer for the transistor.

The integrated circuit design unit 1240 of the system 1200 is capable of providing a circuit design that may be manufactured by the semiconductor processing system 1210. The design unit 1240 may receive data relating to the functional cells to utilize, as well as the design specifications for the integrated circuits to be designed. In one embodiment, the integrated circuit design unit 1240 provide information as to placement of flyover metal features, certain MOL features to shield from contact using a cover layer, etc., while conforming with design rules and cell dimension constraints.

In other embodiments, the integrated circuit design unit 1240 may perform an automated determination of the shifts, automatically select a substitute or child, and automatically incorporate the substitute cell into a design. For example, once a designer or a user of the integrated circuit design unit 1240 generates a design using a graphical user interface to communicate with the integrated circuit design unit 1240, the unit 1240 may perform automated modification of the design for forming smaller functional cells.

The system 1200 may be capable of performing analysis and manufacturing of various products involving various technologies. For example, the system 400 may design and production data for manufacturing devices of CMOS technology, Flash technology, BiCMOS technology, power devices, memory devices (e.g., DRAM devices), NAND memory devices, and/or various other semiconductor technologies. Embodiments herein provide for fabricating memory devices comprising NMOS and/or PMOS devices, such as FD SOI transistors, e.g., 22FDSOI transistors.

The methods described above may be governed by instructions that are stored in a non-transitory computer readable storage medium and that are executed by, e.g., a processor in a computing device. Each of the operations described herein (e.g., FIG. 12) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The drawings herein are illustrative only and are not drawn to scale. The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
    determining a first location for a non-contact intersection region between a first middle of line (MOL) interconnect feature and a metal feature in a functional cell;
    forming a dielectric feature over said first MOL interconnect feature at said first location; and
    forming said metal feature over said dielectric feature, said dielectric feature providing a predetermined amount of voltage isolation between said first MOL interconnect feature and said metal feature, wherein forming said metal feature over said dielectric feature comprises:
    forming said first MOL interconnect feature and a second MOL interconnect feature;
    performing a post-fill chemical-mechanical process;
    depositing a dielectric layer over said first and second MOL features;
    forming an etch-resistant formation above said first location;
    performing an etch process for removing a portion of said dielectric layer for forming said dielectric feature;
    depositing an inter-layer dielectric (ILD) layer;
    performing a metal trench patterning process in said ILD layer for forming a trench comprising said dielectric feature; and
    depositing a metal material in said trench for forming said metal feature, wherein said metal feature is in contact with said second MOL interconnect feature and not in contact with said first MOL interconnect feature.

2. The method of claim 1, wherein forming said etch-resistant formation comprises:
    depositing a photoresist layer; and
    performing a photolithography process for forming said etch-resistant formation above said first location.

3. The method of claim 1, wherein further comprising:
    forming a first gate formation on a first side of said first and second MOL interconnect features;
    forming a second gate formation on a second side of said first and second MOL interconnect features wherein said first and second MOL interconnect features are between said first and second gate formations; and
    forming said metal feature above said first and second MOL interconnect features and above said first and second gate features, wherein said metal feature only makes contact with said second MOL interconnect feature.

4. The method of claim 3, wherein forming said metal feature comprises forming a third MOL interconnect feature for providing a connection between said first gate and said second gate and not connecting said third MOL feature to said first MOL interconnect feature.

5. The method of claim 4, wherein forming said third MOL interconnect feature comprises forming a CB feature.

6. The method of claim 1, wherein forming said first MOL interconnect feature comprises forming a first CA feature, and wherein forming said second MOL interconnect feature comprises forming a second CA feature.

7. The method of claim 1, forming said metal feature comprises forming a Metal-1 layer (M1) metal feature.

8. The method of claim 1, wherein said dielectric feature provides a predetermined capacitive parameter between said first MOL interconnect feature and said metal feature.

9. A method, comprising:
    forming a first gate structure and a second gate structure in an integrated circuit;
    forming a source structure and a drain structure;
    forming a first middle of line (MOL) interconnect feature between said first and second gate structures;
    forming a second MOL interconnect feature for operatively coupling said first and second gate structures;
    forming a metal feature for coupling said source and drain structures; and
    forming a cover layer over at least a portion of said first and second MOL interconnect features for providing a predetermined amount of voltage isolation between said first MOL interconnect feature and said metal feature, wherein forming said cover layer comprises:
    depositing a dielectric layer over said first and second MOL features;
    forming said cover layer above said first and second MOL features;
    performing an etch process for removing a portion of said cover layer not overlying said portion of said first and second MOL interconnect features;
    depositing an inter-layer dielectric (ILD) layer;
    performing a metal trench patterning process in said ILD layer for forming a trench comprising said cover layer; and
    depositing a metal material in said trench for forming said metal feature.

10. The method of claim 9, further comprising:
    forming a first active area, wherein said source region is formed in said first active area;
    forming a second active area, wherein said drain region is formed in said second active area;
    forming a first power rail proximate said first active area; and
    forming a second power rail proximate said second active area.

11. The method of claim 9, wherein forming said etch-resistant formation comprises:
    depositing a photoresist layer; and
    performing a photolithography process for forming said etch-resistant formation.

12. The method of claim 9, wherein forming said first MOL interconnect feature comprises forming a CA feature, and forming said second MOL interconnect feature comprises forming a CB bar.

13. The method of claim 9, wherein forming said metal feature comprises forming a Metal-1 layer (M1) metal feature.

* * * * *